United States Patent
Dong

(10) Patent No.: US 12,000,779 B2
(45) Date of Patent: Jun. 4, 2024

(54) OPTICAL DETECTOR

(71) Applicant: HAMAMATSU PHOTONICS K.K., Hamamatsu (JP)

(72) Inventor: Wei Dong, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 365 days.

(21) Appl. No.: 17/543,936

(22) Filed: Dec. 7, 2021

(65) Prior Publication Data

US 2022/0205910 A1 Jun. 30, 2022

(30) Foreign Application Priority Data

Dec. 25, 2020 (JP) ................................. 2020-216822

(51) Int. Cl.
*G01N 21/45* (2006.01)
*G01J 1/44* (2006.01)

(52) U.S. Cl.
CPC ............... *G01N 21/45* (2013.01); *G01J 1/44* (2013.01)

(58) Field of Classification Search
CPC .. G01N 21/45; G01N 21/25; G01N 2021/258; G01J 1/44; G01J 2001/4295; G01J 1/42; H01L 31/022408; H01L 31/02327; H01L 31/035281; H01L 31/09
See application file for complete search history.

(56) References Cited

U.S. PATENT DOCUMENTS

2018/0212080 A1* 7/2018 Meyer .................. H01L 31/105

FOREIGN PATENT DOCUMENTS

JP 5952108 B2 7/2016

* cited by examiner

*Primary Examiner* — Thanh Luu
*Assistant Examiner* — Monica T Taba
(74) *Attorney, Agent, or Firm* — Faegre Drinker Biddle & Reath LLP

(57) ABSTRACT

An optical detector includes a semiconductor base portion of a first conductivity type having a first surface and a second surface and provided with a projection projecting from the second surface, a first metal electrode layer provided on the first surface or the second surface of the semiconductor base portion, a semiconductor layer of a second conductivity type having a first portion covering the second surface of the semiconductor base portion and second portions covering side surfaces of the projection, and a second metal electrode layer provided in close contact with the second semiconductor layer such that the projection and the second portions of the second semiconductor layer are interposed therebetween. An MIM resonator is constituted by the projection, the second portions of the second semiconductor layer, and the second metal electrode layer between which the projection and the second portions of the semiconductor layer are interposed.

6 Claims, 9 Drawing Sheets

OPTICAL DETECTOR

TECHNICAL FIELD

The present disclosure relates to an optical detector.

BACKGROUND

In the related art, an optical detector using a surface plasmon at an interface between a metal layer and a semiconductor layer is known. For example, an optical detector described in Japanese Patent No. 5952108 includes a stacked structure having a first metal layer, a semiconductor layer stacked on the first metal layer, and a second metal layer stacked on the semiconductor layer. This stacked structure constitutes a so-called metal-insulator-metal (MIM) resonator, and the semiconductor layer is constituted as one layer by a stacked body of a semiconductor layer whose conductivity type is a p type and a semiconductor layer whose conductivity type is an n type.

SUMMARY

In the above-mentioned optical detector, it is necessary to form a thickness of the semiconductor layer on the order of nanometers. Therefore, from the viewpoint of increasing a manufacturing yield of the optical detector, it is preferable to devise a method for more reliably preventing a short circuit between a semiconductor base portion and a metal electrode layer. Further, from the viewpoint of increasing a manufacturing yield of the optical detector, it is necessary to devise a method for facilitating control of a position of a depletion layer in the semiconductor which is a light receiving region.

The present disclosure has been made to solve the above problems, and an object of the present disclosure is to provide an optical detector of which a manufacturing yield can be improved by preventing a short circuit between the semiconductor base portion and the metal electrode layer and facilitating the control of the position of the depletion layer in the semiconductor.

An optical detector according to an aspect of the present disclosure includes: a semiconductor base portion constituted by a first conductivity type semiconductor, having a first surface and a second surface facing the first surface, and provided with a projection projecting from the second surface; a first metal electrode layer provided on the first surface or the second surface of the semiconductor base portion; a semiconductor layer constituted by a second conductivity type semiconductor and having a first portion covering the second surface of the semiconductor base portion and second portions covering side surfaces of the projection; and second metal electrode layers provided in close contact with the semiconductor layer such that the projection and the second portions of the semiconductor layer are interposed therebetween, wherein an MIM resonator is constituted by the projection, the second portions of the semiconductor layer, and the second metal electrode layers between which the projection and the second portions of the semiconductor layer are interposed, and wherein a resonator length of the MIM resonator is a length in which a surface plasmon is excited by incident light having a wavelength longer than the wavelength of absorption edge of each of the semiconductor base portion and the semiconductor layer and a phonon is excited by an electric field formed by a resonance of the surface plasmon.

In the optical detector, the first portion of the semiconductor layer covers the second surface of the semiconductor base portion, and thus it is possible for the first portion to have a function of preventing a short circuit between the semiconductor base portion and each of the second metal electrode layers. According to this configuration, a step of separately forming the insulating layer on the second surface of the semiconductor base portion provided with the projection can be omitted, and thus the manufacturing step can be simplified. Further, in the optical detector, the second portions of the semiconductor layer cover the side surfaces of the projection projecting from the second surface of the semiconductor base portion, and further, the second metal electrode layers are provided such that the projection and the second portions of the semiconductor layer are interposed therebetween. As a result, the MIM resonator is formed. A semiconductor depletion layer serving as a light receiving region is formed in a portion from an interface between the projection and the semiconductor layer toward a center side of the projection. A position of the depletion layer can be easily controlled by adjusting a carrier concentration of each of the projection and the semiconductor layer. As described above, in the optical detector, it is possible to realize an improvement of the manufacturing yield.

In the semiconductor layer, a thickness of each of the second portions may be smaller than a thickness of the first portion. In this case, in the electric field which is generated by the MIM resonator, it is possible to form a region in which a gradient of the electric field is sharp to be increased within a range of the depletion layer. Therefore, the photoelectric conversion efficiency of the incident light can be improved, and the detection responsiveness can be improved.

The semiconductor layer may have a third portion covering a top surface of the projection, and the second metal electrode layers may have an electrode portion therebetween covering the third portion of the semiconductor layer. In this configuration, it is not necessary to perform lift-off after forming the second metal electrode layers on the second semiconductor layer. Therefore, the manufacturing step can be further simplified.

An insulating layer may be provided on a top surface of the projection across the top surface and the second portions of the semiconductor layer, and the second metal electrode layer may have an electrode portion therebetween covering the insulating layer and connecting portions between which the projection and the second portions of the semiconductor layer are interposed. In this case, utilization efficiency of the electric field formed by the resonance of the surface plasmon can be improved as compared with the form in which the semiconductor layer is provided on the top surface of the projection. Further, for example, by leaving a mask used for etching the semiconductor base portion as the insulating layer, it is possible to avoid complexity of the manufacturing step.

In a case in which a wavelength of the surface plasmon is $\lambda p$, a height H of the projection from the first portion of the semiconductor layer may satisfy $2/8\ \lambda p < H < 5/8\ \lambda p$. The height H of the projection corresponds to the resonator length in the MIM resonator. By setting the height H in the above range, it is possible to suppress reflection of the incident light. Therefore, most of the incident light can be used as a component of near-field light, and efficiency of forming the electric field at the projection can be improved.

A plurality of the projections may be provided at regular intervals in an in-plane direction of the second surface of the semiconductor base portion, and in a case in which a wavelength of the surface plasmon is $\lambda p$, a pitch P from a side surface of one projection to the same side surface of an adjacent projection may satisfy 9/10 λp<P<11/10 λp. In this case, it is possible to realize an improvement of the efficiency of forming the electric field using interference light conversion between the adjacent MIM resonators.

DETAILED DESCRIPTION

Hereinafter, preferred embodiments of an optical detector according to an aspect of the present disclosure will be described in detail with reference to the drawings.

First Embodiment

Figure 1A:
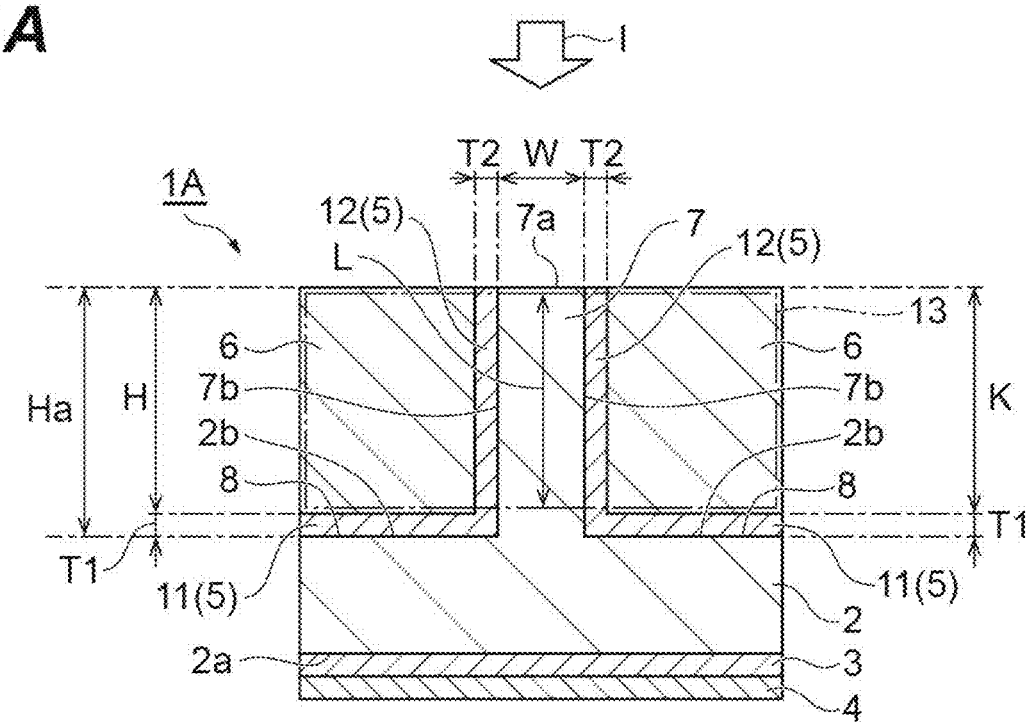
FIG. 1A is a schematic cross-sectional view showing a configuration of an optical detector according to a first embodiment.
Figure 1B:
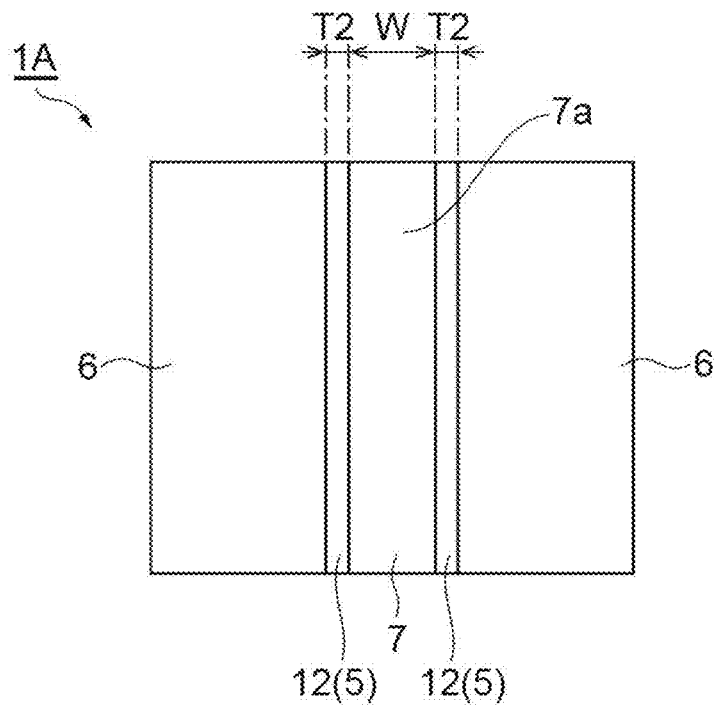
FIG. 1B is a plan view thereof.

FIG. 1A is a schematic cross-sectional view showing a configuration of an optical detector according to a first embodiment, and FIG. 1B is a plan view thereof. As shown in the drawings, an optical detector 1A includes a semiconductor base portion 2, a first semiconductor layer 3, a first metal electrode layer 4, a second semiconductor layer (a semiconductor layer) 5, and a second metal electrode layer 6. In the present embodiment, for convenience, a side of the first metal electrode layer 4 is defined as a back surface side of the optical detector 1A, and a side of the second metal electrode layer 6 is defined as a front surface side of the optical detector 1A. The optical detector 1A is a surface incidence type optical detector in which incident light I is incident from the front surface side (the side of the second metal electrode layer 6).

In the optical detector 1A, in a case in which light having a wavelength longer than the wavelength of absorption edge of a semiconductor (a wavelength of light having energy exceeding a band gap) is incident as the incident light I, a surface plasmon is excited by the incident light I, and a phonon is excited by an electric field formed by a resonance of the surface plasmon. Therefore, in the optical detector 1A, in addition to photon energy of the incident light I, photon vibration energy formed by multi-step excitation of the phonon can be used, and electron transition in the semiconductor becomes possible. In the optical detector 1A, the light absorption occurring in the semiconductor is taken out to the outside as photoelectrons, and thus optical detection for a wavelength longer than the wavelength of absorption edge of the semiconductor is realized. Here, assuming that a wavelength of the incident light I to be detected is 1250 nm, dimensions and the like of each component of the optical detector 1A are illustrated.

The semiconductor base portion 2 is constituted by, for example, a semiconductor formed of Si whose conductivity type is an n type. The semiconductor base portion 2 is a rectangular substrate in a plan view and has a first surface 2a and a second surface 2b facing the first surface 2a. Here, the first surface 2a is a surface facing the back surface side of the optical detector 1A, and the second surface 2b is a surface facing the front surface side of the optical detector 1A. A thickness of the semiconductor base portion 2 (a thickness from the first surface 2a to the second surface 2b) is, for example, 50 μm.

The first semiconductor layer 3 is constituted by a semiconductor formed of Si whose conductivity type is an n+ type. The first semiconductor layer 3 is provided over the entire surface of the semiconductor base portion 2 on a side of the first surface 2a. A thickness of the first semiconductor layer 3 is about 1 μm in a case in which the first semiconductor layer 3 is formed by being doped to the semiconductor base portion 2, for example. In addition, for example, an n+ type substrate having a sufficient thickness which has an n− type epitaxial growth layer having a thickness of 50 μm can be used, and a method of polishing the n+ type substrate to a thickness of 50 μm to improve transmittance of the substrate can also be employed. In this case, the semiconductor base portion 2 having a thickness of 50 μm and the first semiconductor layer 3 having a thickness of 50 μm can be obtained.

The semiconductor base portion 2 has a projection 7 projecting from the second surface 2b. A recess 8 is formed on each side of the projection 7. That is, the second surface 2b of the semiconductor base portion 2 is provided with a fine projecting and recessed structure formed by the projection 7 and the recess 8. In the present embodiment, as shown in FIG. 1B, the projection 7 has a rectangular shape in a plan view and extends linearly in one direction of an in-plane direction of the second surface 2b of the semiconductor base portion 2. In the example of FIG. 1B, the projection 7 extends from one end to the other end of the second surface 2b of the semiconductor base portion 2. A height Ha of the projection 7 from the second surface 2b is larger than a width W of the projection 7. As an example, the height Ha of the projection 7 is 160 nm, and the width W of the projection 7 is 70 nm. The relationship between the height Ha of the projection 7 and the width W of the projection 7 is not limited to this, and the height Ha of the projection 7 may be equal to the width W of the projection 7, while the height Ha of the projection 7 may be smaller than the width W of the projection 7.

The projection 7 has a top surface 7a located at a tip end in a projecting direction and a pair of side surfaces 7b and 7b facing each other in a direction of the width W. The top surface 7a is a rectangular surface parallel to the second surface 2b of the semiconductor base portion 2, and the side surface 7b is a rectangular surface orthogonal to the second surface 2b of the semiconductor base portion 2. A bottom surface of each of the recesses 8 located on both sides of the projection 7 is defined by the second surface of the semiconductor base portion 2, and the inner side surface of each of the recesses 8 is defined by the side surface 7b of the projection 7.

The first metal electrode layer 4 is a metal electrode layer that functions as an anode of the optical detector 1A. The first metal electrode layer 4 is formed of, for example, a metal such as aluminum (Al), titanium (Ti), indium (In), nickel (Ni), platinum (Pt) or gold (Au). The first metal electrode layer 4 may be a compound material containing these metals. The first metal electrode layer 4 is in close contact with the entire surface of the first semiconductor layer 3 to form an ohmic junction with the first semiconductor layer 3. A thickness of the first metal electrode layer 4 is, for example, 100 nm. The first metal electrode layer 4 is not limited to a single layer and may be constituted by a plurality of layers.

The second semiconductor layer 5 is constituted by a semiconductor formed of Si whose conductivity type is P+ type. A carrier concentration of the second semiconductor layer 5 is higher than a carrier concentration of the semiconductor base portion 2 (the projection 7). The second semiconductor layer 5 has a first portion 11 that covers the second surface 2b of the semiconductor base portion 2 and a second portion 12 that covers the side surface 7b of the projection 7. Both the first portion 11 and the second portion 12 are located in the recess 8. The first portion 11 is provided to cover the entire surface of the second surface 2b of the semiconductor base portion 2 on the bottom surface of the recess 8. The second portion 12 is provided to cover the entire surface of the side surface 7b of the projection 7 on the inner surface of the recess 8. A semiconductor pn junction is formed at an interface between the first portion 11 and the second surface 2b of the semiconductor base portion 2 and at an interface between the second portion 12 and the side surface 7b of the projection 7.

In the example of FIG. 1A, a thickness T1 of the first portion 11 and a thickness T2 of the second portion 12 are equal to each other. As an example, each of the thickness T1 of the first portion 11 and the thickness T2 of the second portion 12 is 40 nm. The top surface 7a of the projection 7 is not covered with the second semiconductor layer 5, and in a plan view of the optical detector 1A from the front surface side, as shown in FIG. 1B, the second portion 12 that covers one side surface 7b and the second portion 12 that covers the other side surface 7b extend from one end of the second surface 2b of the semiconductor base portion 2 to the other end thereof together with the top surface 7a.

The second metal electrode layer 6 is a metal electrode layer that functions as a cathode of the optical detector 1A. The second metal electrode layer 6 is formed of, for example, a metal such as gold (Au), aluminum (Al), platinum (Pt), titanium (Ti), indium (In), or nickel (Ni). The second metal electrode layer 6 may be a compound material containing these metals. The second metal electrode layers 6 fill the recesses 8 on both sides of the projection 7 and are provided such that the projection 7 and the second portions 12 of the second semiconductor layer 5 are interposed therebetween. The second metal electrode layer 6 is in close contact with the first portion 11 of the second semiconductor layer 5 on the bottom surface side of the recess 8, and is in close contact with the second portion 12 of the second semiconductor layer 5 on the inner side surface side of the recess 8 to form an ohmic junction with the second semiconductor layer 5. The second metal electrode layer 6 is not limited to a single layer and may be constituted by a plurality of layers.

In the example of FIG. 1A, a height K of the second metal electrode layer 6 matches a height H (=Ha−T1) of the projection 7 from the first portion 11 of the second semiconductor layer 5. As an example, each of the height K of the second metal electrode layer 6 and the height H of the projection 7 from the first portion 11 is 120 nm. As a result, a top surface of the second metal electrode layer 6 is flush with the top surface 7a of the projection 7. Further, the top surface 7a of the projection 7 and the second portions 12 and 12 on both sides of the top surface 7a are exposed from the second metal electrode layer 6 (see FIG. 1B).

As shown in FIG. 1A, the projection 7, the second portion 12 of the second semiconductor layer 5, and the second metal electrode layers 6 and 6 between which the projection 7 and the second portions 12 are interposed constitute a metal-insulator-metal resonator (hereinafter referred to as an "MIM resonator") 13. A junction direction A of the MIM resonator 13 is a direction in which the second metal electrode layer 6, the second portion 12 of the second semiconductor layer 5, the projection 7, the second portion 12 of the second semiconductor layer 5, and the second metal electrode layer 6 are arranged. The junction direction A of the MIM resonator 13 coincides with the in-plane direction of the second surface 2b of the semiconductor base portion 2.

A resonator length L of the MIM resonator 13 is defined by a close contact width of the second portion 12 of the second semiconductor layer 5 and the second metal electrode layer 6 which are in close contact with the side surface 7b of the projection 7. In the example of FIG. 1A, the resonator length L of the MIM resonator 13 matches the height H of the projection 7 from the first portion 11 of the second semiconductor layer 5. Further, the resonator length L of the MIM resonator 13 also matches the height K of the second metal electrode layer 6. The resonator length L is a length in which a surface plasmon is excited by the incident light I having a wavelength longer than the wavelength of absorption edge of the semiconductor layer and a phonon is excited by an electric field formed by a resonance of the surface plasmon.

In a case in which a wavelength of the surface plasmon is $\lambda p$, the resonator length L of the MIM resonator 13, that is, the height H of the projection 7 from the first portion 11 of the second semiconductor layer 5, preferably satisfies $2/8 \lambda p < H < 5/8 \lambda p$. In a case in which the wavelength of the incident light I is AO, a dielectric constant of the semiconductor base portion 2 is $\varepsilon d$, and a dielectric constant of the second metal electrode layer 6 is $\varepsilon m$, the wavelength $\lambda p$ of the surface plasmon can be obtained by $\lambda p = \lambda 0 \times ((\varepsilon m + \varepsilon d)/(\varepsilon m - \varepsilon d))^{1/2}$. In a case in which the wavelength AO of the incident light is 1250 nm, the wavelength $\lambda p$ of the surface plasmon is estimated to be about 340 nm. In this case, the height H of the projection 7 from the first portion 11 is preferably in a range of 85 nm to 213 nm.

In the example of FIG. 1A, the height H of the projection 7 from the first portion 11 is 120 nm, which corresponds to resonance of light having a wavelength of 1250 nm. At this time, the electric field which is generated in the vicinity of the projection 7 by the MIM resonator 13 becomes maximum on both sides of the projection 7 in the width direction and becomes zero near the center of the projection 7 in a width direction. Therefore, the electric field which is generated in the vicinity of the projection 7 changes sharply from the maximum to zero in a narrow region having about a width W of the projection 7.

As an example, assuming that the carrier concentration of the second semiconductor layer 5 is $1 \times 10^{18}$ cm$^{-3}$ or more and the carrier concentration of the projection 7 is $1 \times 10^{17}$ cm$^{-3}$ or less, a depletion layer can be formed over 110 nm or more from the interface of the pn junction between the second portion 12 of the second semiconductor layer 5 and the side surface 7b of the projection 7 to a central side of the projection 7 in the width direction. As a result, it is possible to position the depletion layer in a region where the electric field changes sharply, and it is possible to efficiently perform photoelectric conversion of the incident light I. In the present embodiment, a photocurrent obtained by the photoelectric conversion of the incident light I will flow from the center side of the projection 7 in the width direction toward each of the second metal electrode layers 6 and 6 on both sides of the projection 7.

Further, assuming that the thickness T2 of the second portion 12 is 100 nm or less and the total width (=W+2×T2) of the width of the projection 7 and the widths of the second portions 12 between which the projection 7 is interposed is 250 nm or less, it is possible to sufficiently increase the electric field which is generated in the vicinity of the projection 7 by the MIM resonator 13, and it becomes easy to position the depletion layer in the region where the electric field changes sharply.

Figure 2A:
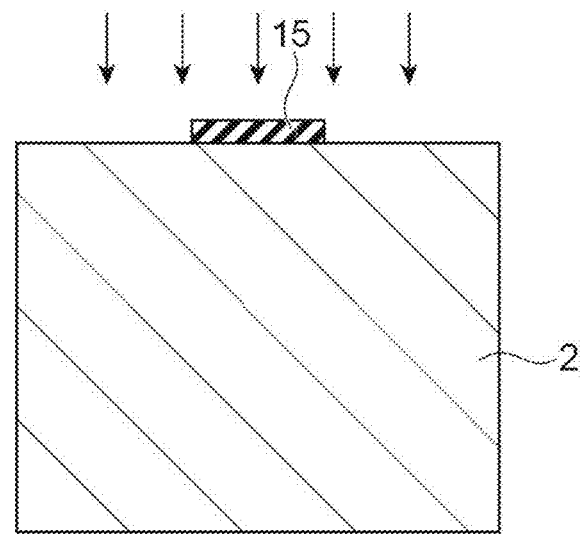
FIG. 2A is a schematic cross-sectional view showing a manufacturing step of the optical detector shown in FIG. 1A, 1B
Figure 2B:
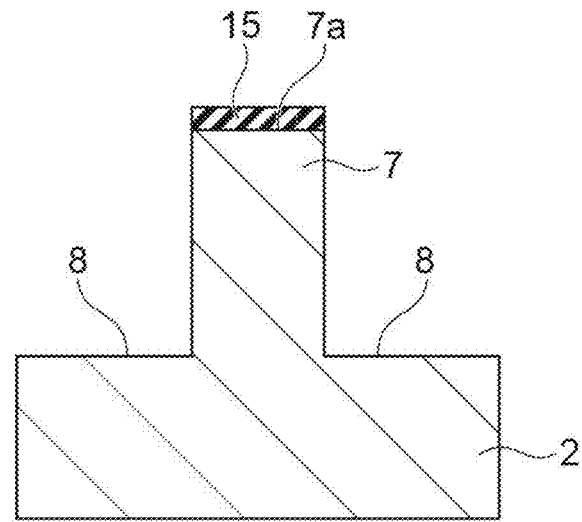
FIG. 2B is a schematic cross-sectional view showing a step subsequent thereto.

In a case in which the above-mentioned optical detector 1A is manufactured, first, as shown in FIG. 2A, the semiconductor base portion 2 is prepared, and a resist layer 15 corresponding to a formation position of the projection 7 on one surface of the semiconductor base portion 2 is patterned. To pattern the resist layer 15, for example, an electron beam drawing apparatus can be used. Next, one surface side of the semiconductor base portion 2 is etched. As a result, as shown in FIG. 2B, the projection 7 is formed in a portion where the resist layer 15 is formed, and the recesses 8 and 8 between which the projection 7 is interposed are formed in a portion where the resist layer 15 is not formed. As a resist material, a material generally used in electron beam drawing, for example, a non-chemically amplified positive electron beam resist, a polymethyl methacrylate resin, or the like, can be used. Examples of an etching method include dry etching using sulfur hexafluoride (SF$_6$) and cyclobutane octafluoride (C$_4$F$_8$).

Figure 3A:
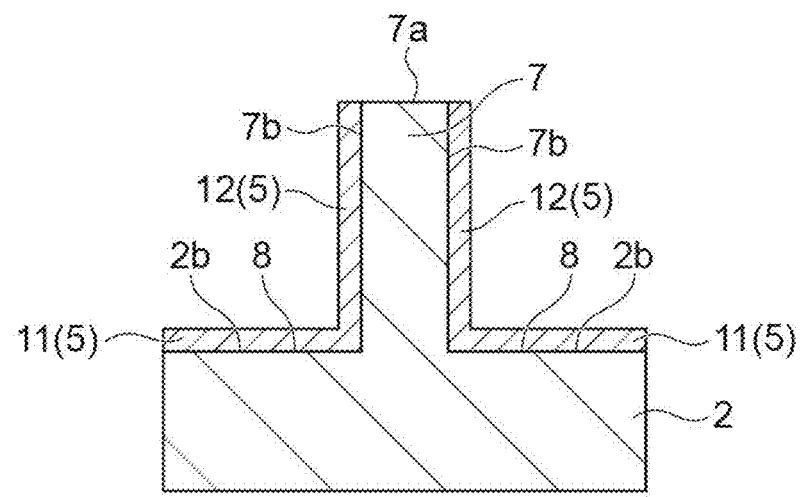
FIG. 3A is a schematic cross-sectional view showing a step subsequent to the step of FIG. 2B.

Next, doping is performed on one surface side of the semiconductor base portion 2, and then the resist layer 15 is removed. When a dopant is injected into a bottom surface portion of the recess 8 and a side surface portion of the projection 7, a second semiconductor layer 5 is formed in the injected portion as shown in FIG. 3A. That is, the first portion 11 of the second semiconductor layer 5 that covers the second surface 2b of the semiconductor base portion 2 and the second portion 12 of the second semiconductor layer 5 that covers the side surface 7b of the projection 7 are formed. Examples of the dopant include boron (B), gallium (Ga), aluminum (Al), phosphorus (P), arsenic (As), and the like.

Figure 3B:
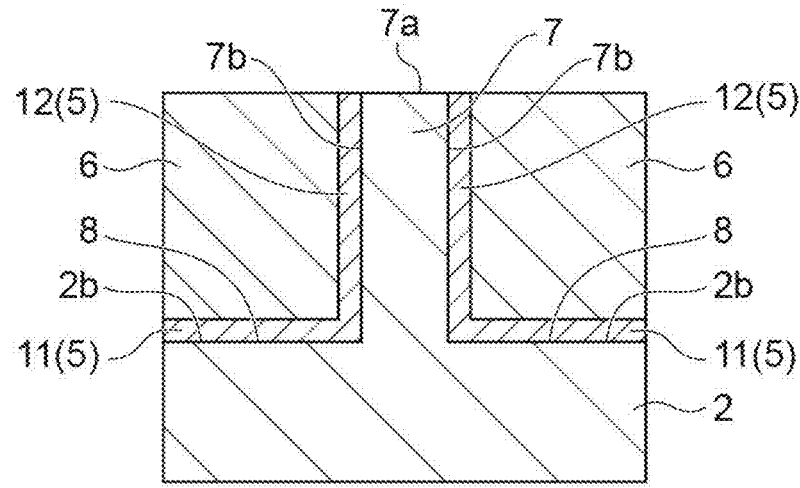
FIG. 3B is a schematic cross-sectional view showing a step subsequent thereto.

After the formation of the second semiconductor layer 5, annealing is performed for activation of the dopant. After the annealing is performed, the second metal electrode layer 6 is formed on the second semiconductor layer 5 by vapor deposition. Then, the second metal electrode layer 6 is lifted off or etched back, and as shown in FIG. 3B, the top surface 7a of the projection 7 and the second portion 12 of the second semiconductor layer 5 are exposed from the second metal electrode layer 6. After that, the first semiconductor layer 3 is formed when the doping is performed on the side of the first surface 2a of the semiconductor base portion 2, and the first metal electrode layer 4 is formed on the first semiconductor layer 3 by vapor deposition. As a result, the optical detector 1A shown in FIGS. 1A and 1B can be obtained. The formation of the first semiconductor layer 3 and the first metal electrode layer 4 may be performed before the formation of the resist layer 15 shown in FIG. 2A.

As described above, in the optical detector 1A, the first portion 11 of the second semiconductor layer 5 covers the second surface 2b of the semiconductor base portion 2, and thus it is possible for the first portion 11 to have a function of preventing a short circuit between the semiconductor base portion 2 and the second metal electrode layer 6. According to this configuration, a step of separately forming the insulating layer on the second surface 2b of the semiconductor base portion 2 provided with the projection 7 can be omitted, and thus a manufacturing step can be simplified. Further, in the optical detector 1A, the second portion 12 of the second semiconductor layer 5 covers the side surface 7b of the projection 7 projecting from the second surface 2b of the semiconductor base portion 2, and further, the second metal electrode layers 6 and 6 are provided such that the projection 7 and the second portions 12 of the second semiconductor layer 5 are interposed therebetween. As a result, the MIM resonator 13 is formed.

In the MIM resonator 13, the semiconductor depletion layer serving as a light receiving region is formed in a portion from the interface between the projection 7 and the second portion 12 of the second semiconductor layer 5 toward the center side of the projection 7. The position of the depletion layer can be easily controlled by adjusting the carrier concentration of each of the projection 7 and the second semiconductor layer 5. For example, even in a case in which the height H of the projection 7 from the first portion 11 is changed according to the resonance of the incident light I, it is possible to easily align the position of the electric field which is generated by the MIM resonator 13 and the position of the depletion layer by adjusting the carrier concentration of the second semiconductor layer 5. As described above, in the optical detector 1A, it is possible to realize an improvement of the manufacturing yield.

Further, in the optical detector 1A, in a case in which the wavelength of the surface plasmon is λp, the height H of the projection 7 from the first portion 11 of the second semiconductor layer 5 satisfies 2/8 λp<H<5/8 λp. The height H of the projection 7 corresponds to the resonator length L in the MIM resonator 13. By setting the height H in the above range, it is possible to suppress reflection of the incident light I. Therefore, most of the incident light I can be used as a component of near-field light, and efficiency of forming the electric field at the projection 7 can be improved.

Second Embodiment

Figure 4A:
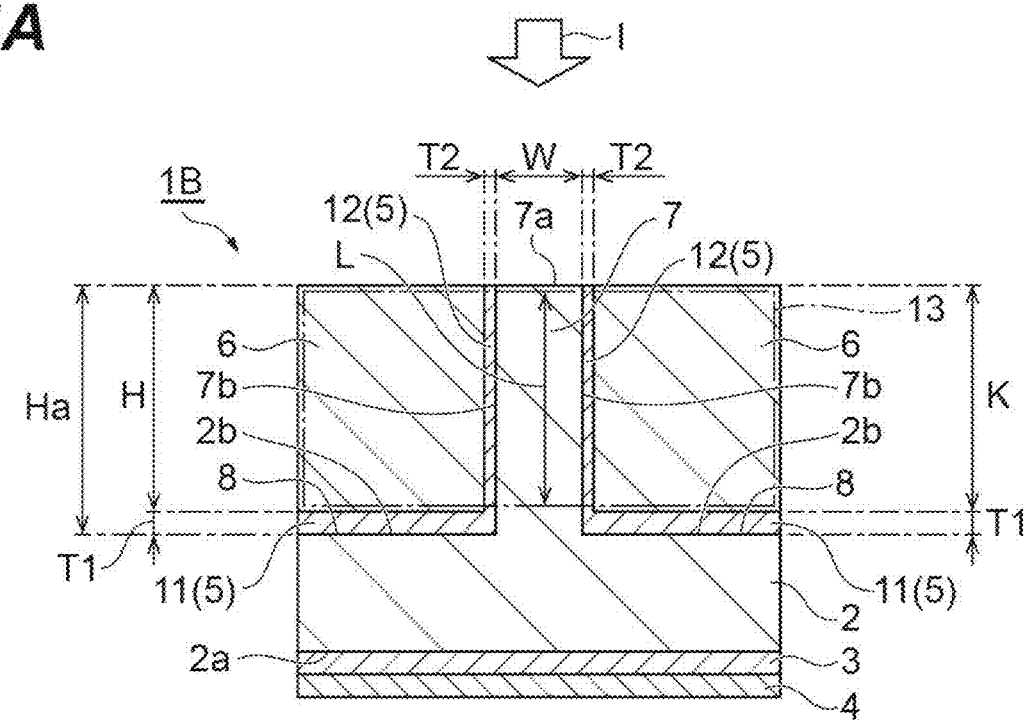
FIG. 4A is a schematic cross-sectional view showing a configuration of an optical detector according to a second embodiment.
Figure 4B:
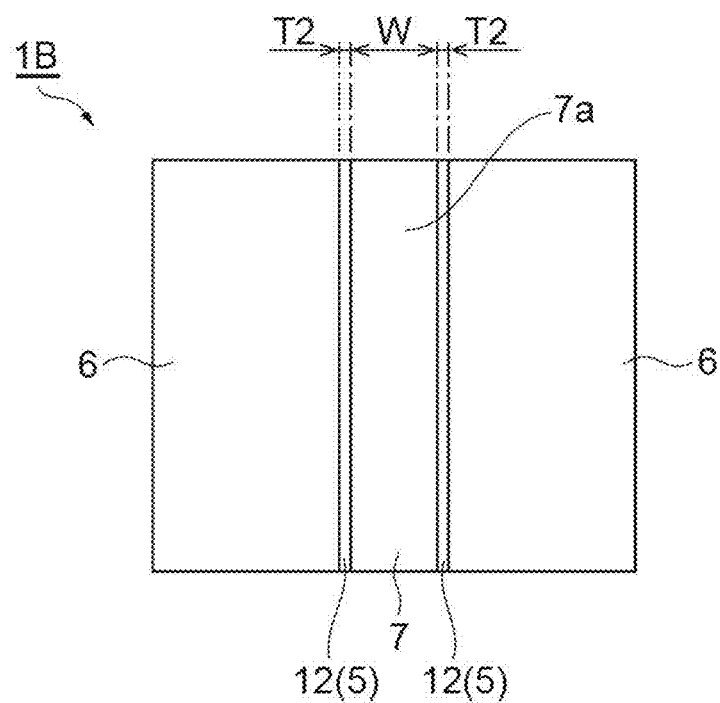
FIG. 4B is a plan view thereof.

FIG. 4A is a schematic cross-sectional view showing a configuration of an optical detector according to a second embodiment, and FIG. 4B is a plan view thereof. As shown in the drawings, an optical detector 1B according to the second embodiment is different from the first embodiment in that in the second semiconductor layer 5, the thickness T2 of the second portion 12 is smaller than the thickness T1 of the first portion 11.

In such an optical detector 1B as well, as in the first embodiment, a manufacturing yield can be improved by preventing a short circuit between the semiconductor base portion 2 and the second metal electrode layer 6 and facilitating the control of the position of the depletion layer in the semiconductor. Further, in the optical detector 1B, the thickness T2 of the second portion 12 is smaller than the thickness T1 of the first portion 11, and thus in the electric field which is generated by the MIM resonator 13, it is possible to form a region in which a gradient of the electric field is sharp to be increased within a range of the depletion layer. As a result, the photoelectric conversion efficiency of the incident light I can be improved, and the detection responsiveness can be improved. From the viewpoint of forming a region in which a gradient of the electric field is sharp to be increased within a range of the depletion layer, it is preferable that the thickness T2 of the second portion 12 be equal to or less than half the thickness T1 of the first portion 11. For example, in a case in which the thickness T1 of the first portion 11 is 40 nm, the thickness T2 of the second portion 12 is preferably 20 nm or less.

Further, in the optical detector 1B, as compared with the first embodiment, in a case in which an interval between the second metal electrode layers 6 and 6 is the same, it is possible to increase the width W of the projection 7 by reducing the thickness T2 of the second portion 12. Therefore, in the electric field which is generated by the MIM resonator 13, it is possible to make the area where a gradient of the electric field is sharp more increased within the range of the depletion layer. On the other hand, in the optical detector 1B, the thickness T1 of the first portion 11 is left thick, and thus the depletion layer is formed far away from the interface between the second metal electrode layer 6 and the first portion 11 of the second semiconductor layer 5. Therefore, it is possible to suppress the generation of leakage current due to interface state. It is possible to realize such a configuration, for example, by injecting the dopant with directivity in a direction along a projecting direction of the projection 7 when the second semiconductor layer 5 is formed.

Third Embodiment

Figure 5A:
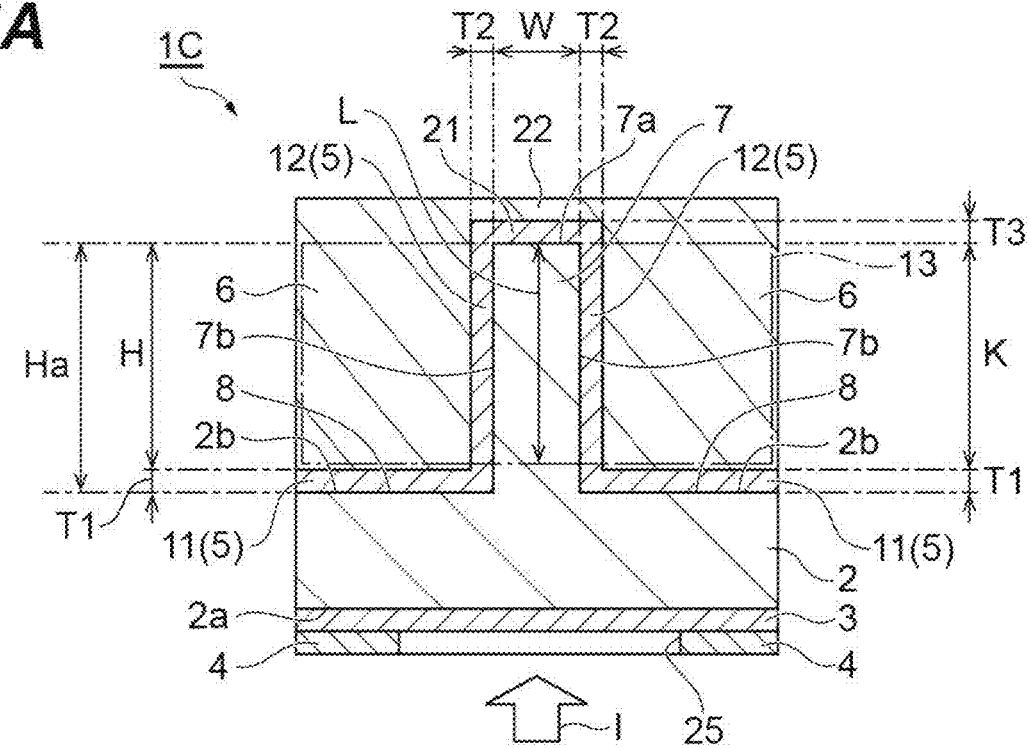
FIG. 5A is a schematic cross-sectional view showing a configuration of an optical detector according to a third embodiment.
Figure 5B:
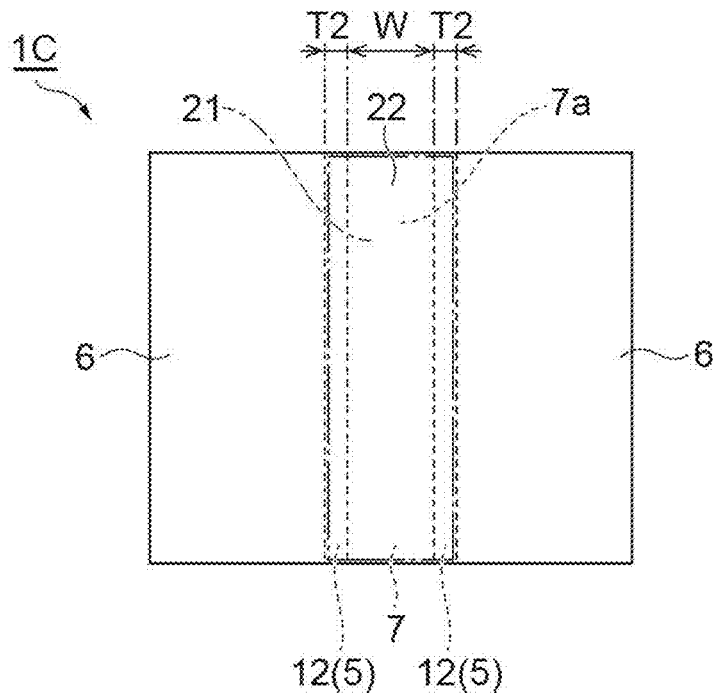
FIG. 5B is a plan view thereof.

FIG. 5A is a schematic cross-sectional view showing a configuration of an optical detector according to a third embodiment, and FIG. 5B is a plan view thereof. As shown in the drawings, an optical detector 1C according to the third embodiment is different from the first embodiment in that the projection 7 of the semiconductor base portion 2 and the second semiconductor layer 5 are embedded in the second metal electrode layer 6.

More specifically, in the optical detector 1C, the second semiconductor layer 5 has a third portion 21 that covers the top surface 7a of the projection 7. The third portion 21 is provided over the entire top surface 7a of the projection 7 and connects the second portion 12 that covers one side surface 7b of the projection 7 and the second portion 12 that covers the other side surface 7b of the projection 7. In the example of FIG. 5A, a thickness T3 of the third portion 21 matches, for example, each of the thickness T1 of the first portion 11 and the thickness T2 of the second portion 12. In the optical detector 1C, the thickness T2 of the second portion 12 may be smaller than the thickness T1 of the first portion 11 as in the second embodiment. The thickness T3 of the third portion 21 may be smaller than the thickness T1 of the first portion 11 or the thickness T2 of the second portion 12.

Further, in the optical detector 1C, the second metal electrode layers 6 have an electrode portion 22 therebetween that covers the third portion 21 of the second semiconductor layer 5. The electrode portion 22 is provided over the entire surface of the third portion 21 of the second semiconductor layer 5 and connects an electrode portion located on a side of one side surface 7b of the projection 7 and an electrode portion located on a side of the other side surface 7b of the projection 7 at the front surface side of the optical detector 1C. A thickness of the electrode portion 22 is not particularly limited, but in the example of FIG. 5A, the thickness of the electrode portion 22 matches the thickness T3 of the third portion 21 of the second semiconductor layer 5.

In such an optical detector 1C as well, as in the first embodiment, a manufacturing yield can be improved by preventing a short circuit between the semiconductor base portion 2 and the second metal electrode layer 6 and facilitating the control of the position of the depletion layer in the semiconductor. In this configuration, it is not necessary to perform lift-off after forming the second metal electrode layer 6 on the second semiconductor layer 5. Therefore, the manufacturing step can be further simplified.

In the optical detector 1C, since the projection 7 is not exposed on the front surface side, it is preferable to use the optical detector as a back surface incidence type optical detector in which the incident light I is incident from the back surface side (the side of the first metal electrode layer 4). In this case, in the optical detector 1C, it is preferable that an opening 25 be provided in the first metal electrode layer 4 such that the first metal electrode layer 4 does not overlap the projection 7 when seen from the back surface side. In a case in which the optical detector 1C is the back surface incidence type, the thickness of the electrode portion 22 is preferably 30 nm or more to prevent light transmission.

Fourth Embodiment

Figure 6A:
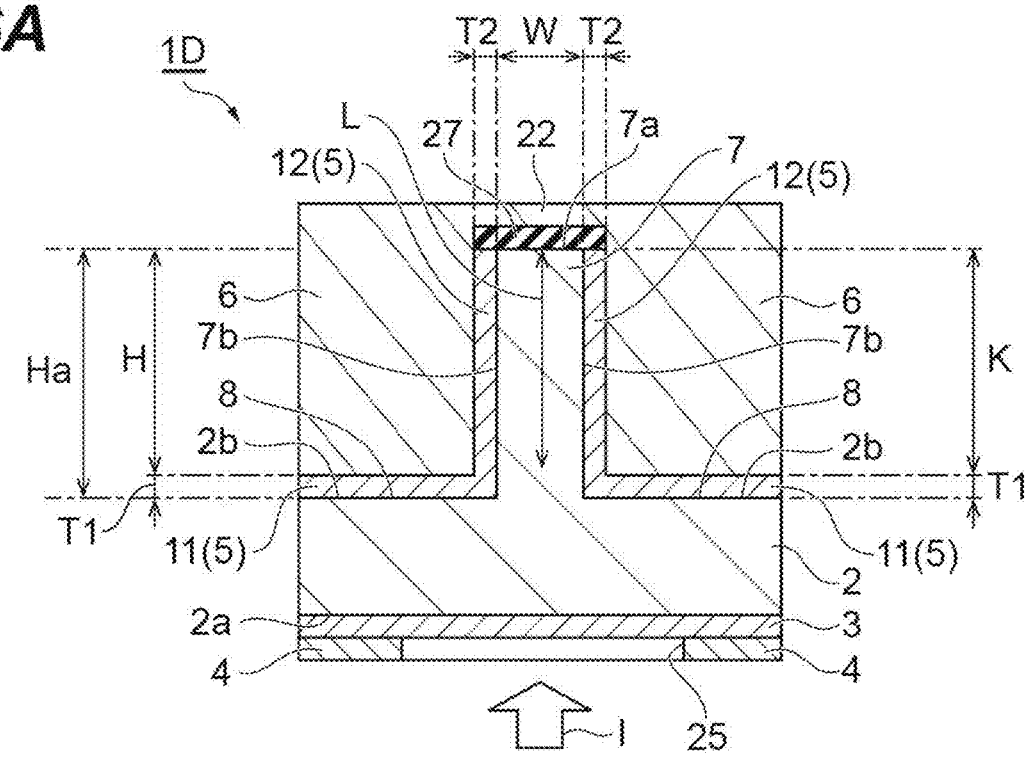
FIG. 6A is a schematic cross-sectional view showing a configuration of an optical detector according to a fourth embodiment.
Figure 6B:
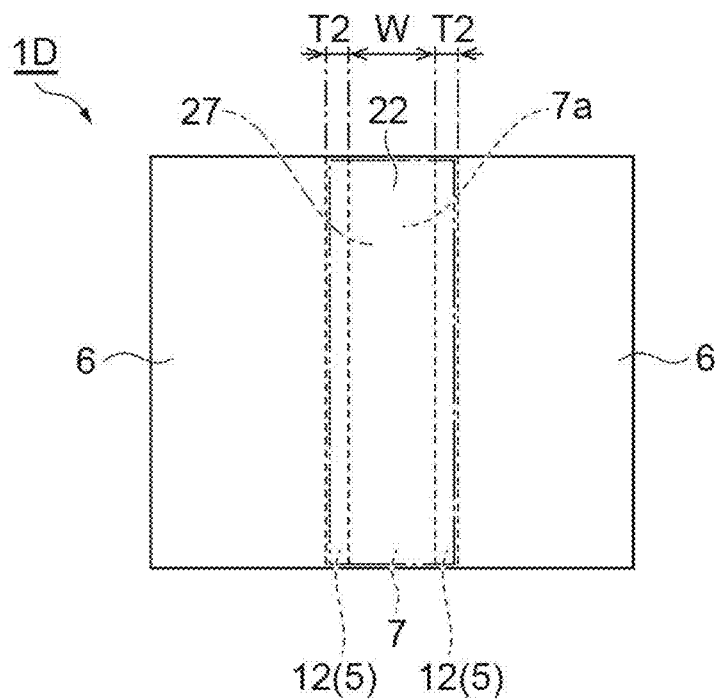
FIG. 6B is a plan view thereof.

FIG. 6A is a schematic cross-sectional view showing a configuration of an optical detector according to a fourth embodiment, and FIG. 6B is a plan view thereof. As shown in the drawings, an optical detector 1D according to the fourth embodiment is different from the third embodiment in that the layer that covers the top surface 7a of the projection 7 is not the third portion 21 of the second semiconductor layer 5 but an insulating layer 27.

Specifically, in the optical detector 1D, the insulating layer 27 is provided on the top surface 7a of the projection 7 across the top surface 7a, the second portion 12 that covers one side surface 7b of the projection 7, and the second portion 12 that covers the other side surface 7b of the projection 7. Further, the second metal electrode layers 6 have the electrode portion 22 therebetween that covers the insulating layer 27. The electrode portion 22 is provided over the entire surface of the insulating layer 27 and connects an electrode portion located on a side of one side surface 7b of the projection 7 and an electrode portion located on a side of the other side surface 7b of the projection 7 at the front surface side of the optical detector 1D.

In such an optical detector 1D as well, as in the first embodiment, a manufacturing yield can be improved by preventing a short circuit between the semiconductor base portion 2 and the second metal electrode layer 6 and facilitating the control of the position of the depletion layer in the semiconductor. Further, in the fourth embodiment, as in the third embodiment, it is not necessary to perform lift-off after forming the second metal electrode layer 6, and thus the manufacturing step can be further simplified. In the optical detector 1D, utilization efficiency of the electric field formed by the resonance of the surface plasmon can be improved as compared with the form in which the second semiconductor layer 5 is provided on the top surface 7a of the projection 7. Further, for example, by leaving the resist layer 15 (see FIGS. 2A and 2B) used for etching the semiconductor base portion 2 as the insulating layer 27, it is possible to avoid complexity of the manufacturing step.

In the optical detector 1D, since the projection 7 is not exposed on the front surface side, it is preferable to use the optical detector as a back surface incidence type optical detector in which the incident light I is incident from the back surface side (the side of the first metal electrode layer 4). In the optical detector 1D, it is preferable that an opening 25 be provided in the first metal electrode layer 4 such that the first metal electrode layer 4 does not overlap the projection 7 when seen from the back surface side.

Modification Example

Figure 7A:
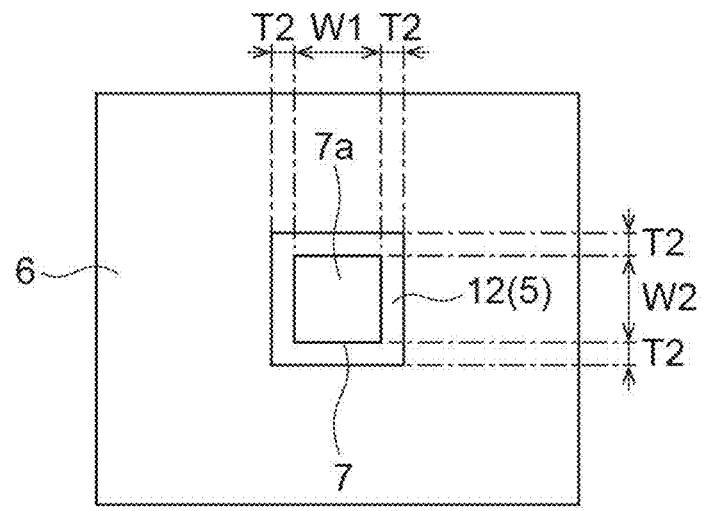
FIGS. 7A to 7C are plan views showing a configuration of an optical detector according to a modification example.

The present disclosure is not limited to the above embodiments. For example, in the above embodiments, the projection 7 extends linearly in one direction of the in-plane direction of the second surface 2b of the semiconductor base portion 2, but the projection 7 may have, for example, a square shape in a cross section as shown in FIG. 7A. In this case, it is possible to detect rays of the incident light I whose polarization directions are orthogonal to each other. That is, in this configuration, it is possible to detect the incident light I whose polarization direction is along a length W1 direction of one side of the projection 7 and the incident light I whose polarization direction is along a length W2 direction of a side orthogonal to the one side. The cross-sectional shape of the projection 7 is not limited to the square shape and may be another shape such as a circular shape.

Figure 7B:
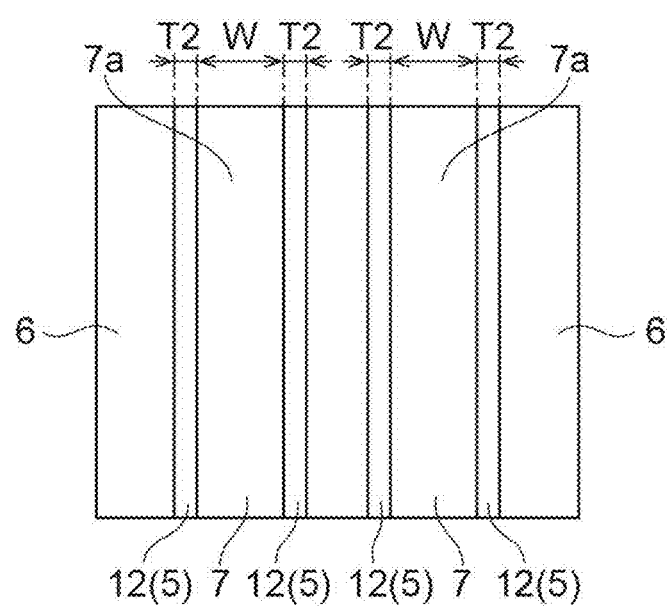

Further, the fine projecting and recessed structure formed by the projection 7 and the recess 8 on a side of the second surface 2b of the semiconductor base portion 2 may have a periodic structure. In this case, for example, as shown in FIG. 7B, a plurality of projections 7 that extends linearly in one direction of the in-plane direction of the second surface 2b of the semiconductor base portion 2 may be arranged at regular intervals in a direction orthogonal to the extending direction. Further, for example, as shown in FIG. 7C, a plurality of projections 7 that have a square shape in a cross section may be arranged in a grid shape at regular intervals in the in-plane direction of the second surface 2b.

Figure 7C:
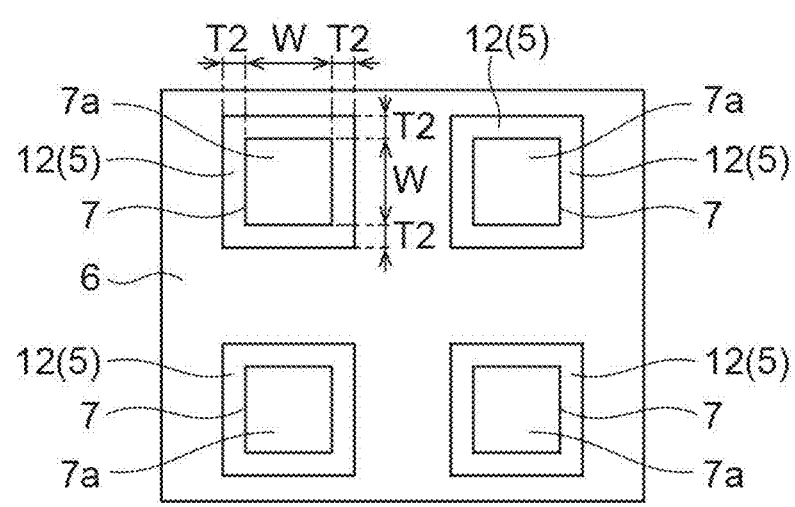
Figure 8:
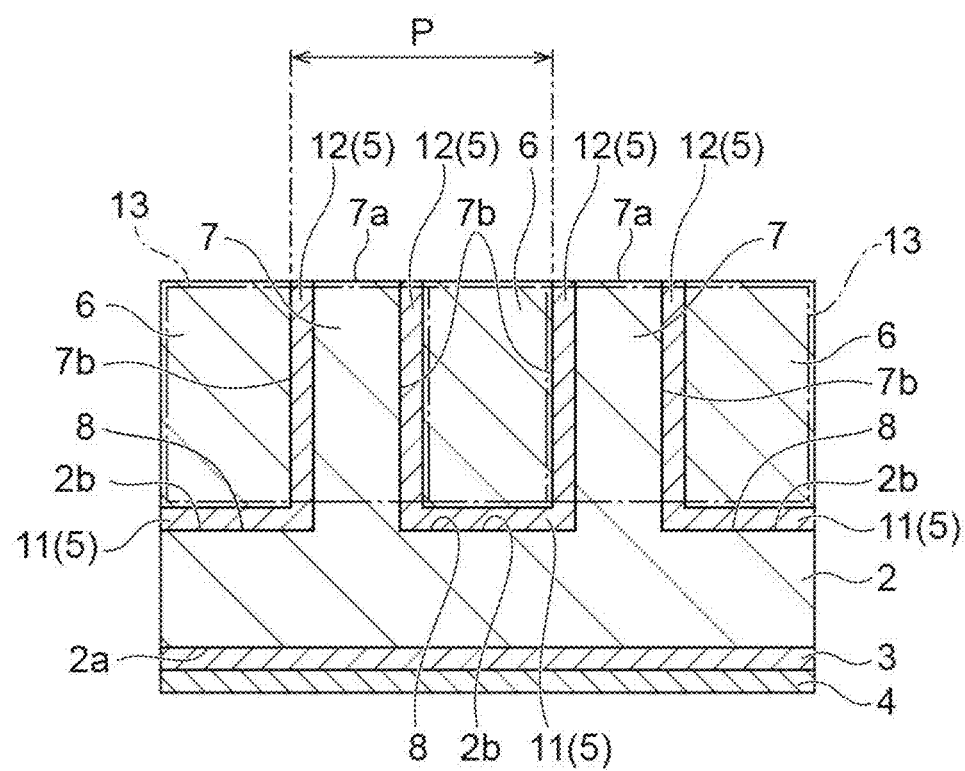
FIG. 8 is a schematic cross-sectional view showing the configuration of the optical detector according to the modification example.

In a case in which the projections 7 are arranged at regular intervals as shown in FIGS. 7B and 7C, when the wavelength of the surface plasmon is λp, it is preferable that a pitch P from a side surface 7b of one projection 7 to the same side surface 7b of an adjacent projection 7 (see FIG. 8) satisfy 9/10 λp<P<11/10 λp. In a case in which the pitch P of the projection 7 satisfies the above range, it is possible to realize an improvement of the efficiency of forming the electric field using interference light conversion between the adjacent MIM resonators 13 and 13. As an example, the pitch P of the projection 7 is 350 nm.

In the above embodiment, a configuration in which the first metal electrode layer 4 is located on the back surface side of the optical detector and the second metal electrode layer is located on the front surface side of the optical detector 1 is illustrated, but the configuration of the metal electrode layers is not limited to this. For example, a part of the second surface 2b of the semiconductor base portion 2 may be exposed from the second semiconductor layer 5 and the second metal electrode layer 6, a semiconductor layer similar to the first semiconductor layer 3 may be formed in the exposed portion, and the first metal electrode layer 4 may be disposed on the semiconductor layer. Further, for example, at a position where a part of the second surface 2b of the semiconductor base portion 2 is exposed from the second semiconductor layer 5 and the second metal electrode layer 6 and does not overlap the second metal electrode layer 6 in a plan view, a penetrating portion that penetrates the first semiconductor layer 3 and reaches the semiconductor base portion 2 may be provided on the first metal electrode layer 4 on a side of the first surface 2a of the semiconductor base portion 2.

In the above embodiments, the conductivity type of the semiconductor base portion 2 is n, the conductivity type of the first semiconductor layer 3 is n+, and the conductivity type of the second semiconductor layer 5 is P+, but these conductivity types may be inverted. In a case in which the conductivity type is inverted, the conductivity type of the semiconductor base portion 2 is p, the conductivity type of the first semiconductor layer 3 is P+, and the conductivity type of the second semiconductor layer 5 is n+.

Example

Figure 9:
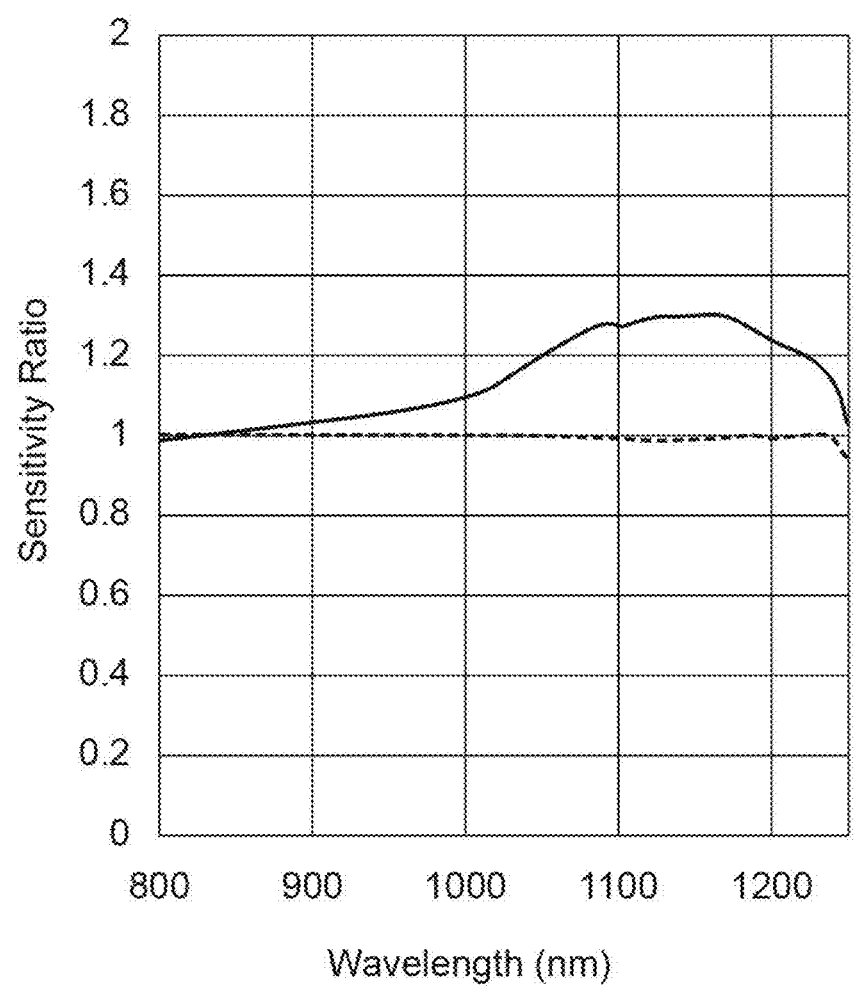
FIG. 9 is a graph showing wavelength characteristics of spectral sensitivity of optical detectors according to an example and a comparative example.

FIG. 9 is a graph showing spectral sensitivity characteristics of optical detectors according to an example and a comparative example. The graph of the drawing compares wavelength characteristics of spectral sensitivity of a sample (an example) having the same configuration as the optical detector 1A shown in FIGS. 5A and 5B and a sample (a comparative example) in which the second semiconductor layer 5 and the second metal electrode layer 6 are flatly stacked on the second surface 2b without the projection 7 provided on the second surface 2b of the semiconductor base portion 2. A horizontal axis of the graph is the wavelength, and a vertical axis is the spectral sensitivity (a normalization value by which the spectral sensitivity of the comparative example becomes 1).

As shown in the drawing, in the wavelength range of 1000 nm or less which is an absorption band of Si, the electric field which is generated in the vicinity of the projection by the MIM resonator is not sufficient in the example, and a significant difference in spectral sensitivity with respect to the comparative example was not observed. In the wavelength range longer than 1000 nm, since the wavelength corresponds to the edge of absorption band of Si, absorption of Si decreases sharply and Si becomes almost transparent with respect to the incident light. In this wavelength range, in the example, an electric field near the projection is generated by the MIM resonator, and the depletion layer is positioned in the region where the electric field changes sharply, and thus it is possible to efficiently perform the photoelectric conversion of the incident light I. From the results of FIG. 9, it was confirmed that the spectral sensitivity of the example was about 1.3 times that of the comparative example in the wavelength range of 1050 nm to 1200 nm and that good spectral sensitivity was obtained.

What is claimed is:
1. An optical detector comprising:
a semiconductor base portion constituted by a first conductivity type semiconductor, having a first surface and a second surface facing the first surface, and provided with a projection projecting from the second surface;
a first metal electrode layer provided on the first surface or the second surface of the semiconductor base portion;
a semiconductor layer constituted by a second conductivity type semiconductor and having a first portion covering the second surface of the semiconductor base portion and second portions covering side surfaces of the projection; and second metal electrode layers provided in close contact with the semiconductor layer such that the projection and the second portions of the semiconductor layer are interposed therebetween, wherein an MIM resonator is constituted by the projection, the second portions of the semiconductor layer, and the second metal electrode layers between which the projection and the second portions of the semiconductor layer are interposed, and wherein a resonator length of the MIM resonator is a length in which a surface plasmon is excited by incident light having a wavelength longer than the wavelength of absorption edge of each of the semiconductor base portion and the semiconductor layer and a phonon is excited by an electric field formed by a resonance of the surface plasmon.

2. The optical detector according to claim 1, wherein, in the semiconductor layer, a thickness of each of the second portions is smaller than a thickness of the first portion.

3. The optical detector according to claim 1,
wherein the semiconductor layer has a third portion covering a top surface of the projection, and
wherein the second metal electrode layers have an electrode portion therebetween covering the third portion of the semiconductor layer and connecting portions between which the projection and the second portions of the semiconductor layer are interposed.

4. The optical detector according to claim 1,
wherein an insulating layer is provided on a top surface of the projection across the top surface and the second portions of the semiconductor layer, and
wherein the second metal electrode layers have an electrode portion therebetween covering the insulating layer.

5. The optical detector according to claim 1, wherein, in a case in which a wavelength of the surface plasmon is $\lambda_p$, a height H of the projection from the first portion of the semiconductor layer satisfies $2/8\ \lambda_p < H < 5/8\ \lambda_p$.

6. The optical detector according to claim 1,
wherein a plurality of the projections are provided at regular intervals in an in-plane direction of the second surface of the semiconductor base portion, and
wherein, in a case in which a wavelength of the surface plasmon is $\lambda_p$, a pitch P from a side surface of one projection to the same side surface of an adjacent projection satisfies $9/10\ \lambda_p < P < 11/10\ \lambda_p$.

* * * * *